United States Patent
Park et al.

(10) Patent No.: US 11,158,720 B2
(45) Date of Patent: Oct. 26, 2021

(54) HIGH VOLTAGE SEMICONDUCTOR DEVICE INCLUDING A DOPED GATE ELECTRODE

(71) Applicant: SK hynix system ic Inc., Chungcheongbuk-do (KR)

(72) Inventors: Soon Yeol Park, Daejeon (KR); Yoon Hyung Kim, Gyeonggi-do (KR); Yu Shin Ryu, Gyeonggi-do (KR)

(73) Assignee: SK hynix system ic Inc., Chungcheongbuk-do (KR)

( * ) Notice: Subject to any disclaimer, the term of this patent is extended or adjusted under 35 U.S.C. 154(b) by 190 days.

(21) Appl. No.: 16/268,685

(22) Filed: Feb. 6, 2019

(65) Prior Publication Data
US 2019/0378908 A1    Dec. 12, 2019

(30) Foreign Application Priority Data

Jun. 11, 2018  (KR) .................. 10-2018-0066709

(51) Int. Cl.
| | |
|---|---|
| *H01L 29/49* | (2006.01) |
| *H01L 29/78* | (2006.01) |
| *H01L 29/10* | (2006.01) |
| *H01L 29/40* | (2006.01) |
| *H01L 29/423* | (2006.01) |
| *H01L 29/66* | (2006.01) |
| *H01L 21/28* | (2006.01) |
| *H01L 21/3215* | (2006.01) |

(52) U.S. Cl.
CPC .... *H01L 29/4983* (2013.01); *H01L 21/28035* (2013.01); *H01L 21/32155* (2013.01); *H01L 29/1095* (2013.01); *H01L 29/408* (2013.01); *H01L 29/42368* (2013.01); *H01L 29/4916* (2013.01); *H01L 29/66681* (2013.01); *H01L 29/7816* (2013.01)

(58) Field of Classification Search
CPC ............ H01L 29/4983; H01L 29/1095; H01L 29/408; H01L 29/42368; H01L 29/7816
USPC .......................................... 257/343, E29.135
See application file for complete search history.

(56) References Cited

U.S. PATENT DOCUMENTS 6,097,070 A  *  8/2000 Mandelman ...... H01L 21/28114
                                                       257/333

FOREIGN PATENT DOCUMENTS

KR      1019920008966        5/1992

* cited by examiner

*Primary Examiner* — Robert T Huber
(74) *Attorney, Agent, or Firm* — IP & T Group LLP

(57) ABSTRACT

A high voltage semiconductor device includes a semiconductor region of a first conductivity type having a first region and a second region, a first insulation pattern disposed over the first region of the semiconductor region. A second insulation pattern is disposed over the second region of the semiconductor region. The second insulation pattern has a thickness greater than a thickness of the first insulation pattern. A gate electrode is disposed over the first and second insulation patterns to have a step structure over a boundary region between the first and second regions. The gate electrode has a doping profile such that a position of a maximum projection range of impurity ions distributed in the gate electrode over the first region is located at substantially the same level as a position of a maximum projection range of impurity ions distributed in the gate electrode over the second region. A top surface of the gate electrode over the second region is located at a level higher than a level of a top surface of the gate electrode over the first region.

10 Claims, 5 Drawing Sheets

HIGH VOLTAGE SEMICONDUCTOR DEVICE INCLUDING A DOPED GATE ELECTRODE

CROSS-REFERENCE TO RELATED APPLICATIONS

The present application claims priority under 35 U.S.C. 119(a) to Korean Application No. 10-2018-0066709, filed on Jun. 11, 2018, which is herein incorporated by reference in its entirety.

BACKGROUND

1. Technical Field

Various embodiments of the present disclosure relate to high voltage semiconductor devices and methods of fabricating the same.

2. Related Art

Integrated circuits having functions of both a controller and a driver may be employed in smart power devices. Output circuits of the smart power devices may be designed to include lateral double diffused MOS (LDMOS) transistors operating at high voltages. Thus, breakdown voltages of the LDMOS transistors, for example, a drain junction breakdown voltage and a gate dielectric breakdown voltage are important factors that may directly influence the stable operation of the LDMOS transistors. In addition, an on-resistance (Ron) value of the LDMOS transistors may also be an important factor that may influence electrical characteristics of the LDMOS transistors, for example, a current drivability of the LDMOS transistors.

SUMMARY

Various embodiments are directed to high voltage semiconductor devices and methods of fabricating the same.

In accordance with an embodiment, a high voltage semiconductor device includes a semiconductor region of a first conductivity type having a first region and a second region, a first insulation pattern disposed over the first region of the semiconductor region to have a first thickness, a second insulation pattern disposed over the second region of the semiconductor region to have a second thickness greater than the first thickness, and a gate electrode disposed over the first and second insulation patterns to have a step structure over a boundary region between the first and second regions. The gate electrode has a doping profile that a position of a maximum projection range of impurity ions distributed in the gate electrode over the first region is located at substantially the same level as a position of a maximum projection range of impurity ions distributed in the gate electrode over the second region.

In accordance with an embodiment, there is provided a method of fabricating a high voltage semiconductor device. The method includes forming a gate pattern over a first region and a second region of a semiconductor region having a first conductivity type. The gate pattern has a stepped surface profile over a boundary region between the first and second regions. A planarized ion implantation buffer layer is formed on the gate pattern. A thickness of the planarized ion implantation buffer layer over the first region is different from a thickness of the planarized ion implantation buffer layer over the second region. Impurity ions are implanted into the gate pattern using the planarized ion implantation buffer layer as a screen layer to form a gate electrode.

In accordance with an embodiment, a semiconductor device comprises a gate electrode disposed over first and second insulation patterns to have a step structure on a boundary region between the first and second insulation patterns. The gate electrode has a doping profile that a position of a maximum projection range of impurity ions distributed in the gate electrode over the first insulation pattern is located at substantially the same level as a position of a maximum projection range of impurity ions distributed in the gate electrode over the second insulation pattern.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to high voltage semiconductor devices and methods of fabricating the same.

Figure 1:
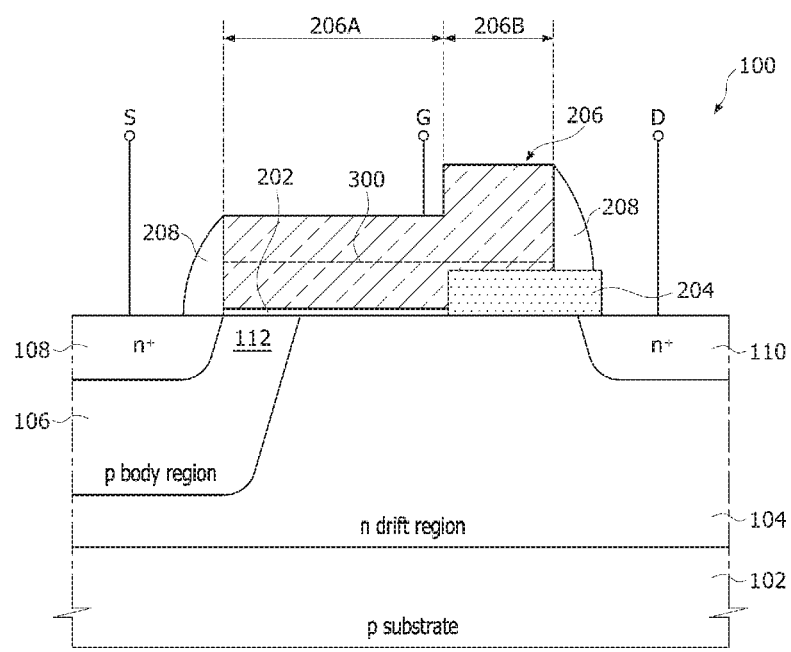
FIG. 1 is a cross-sectional view illustrating a high voltage semiconductor device in accordance with an embodiment of the present disclosure.

FIG. 1 is a cross-sectional view illustrating a high voltage semiconductor device 100 in accordance with an embodiment of the present disclosure. Referring to FIG. 1, the high voltage semiconductor device 100 may include a semiconductor region 104 of a first conductivity type having a first region 206A and a second region 206B. The semiconductor region 104 may be disposed on a substrate 102 of a second conductivity type. In an embodiment, the first conductivity type may be N-type, and the second conductivity type may be P-type. In an embodiment, the semiconductor region 104 may be a drift region. Alternatively, the semiconductor region 104 may be a well region. The first region 206A of the semiconductor region 104 may be defined as a region that vertically overlaps with a first insulation pattern 202 and a portion of a gate electrode 206. The second region 206B of the semiconductor region 104 may be defined as a region that vertically overlaps with a second insulation pattern 204 and another portion of the gate electrode 206. The first and second insulating patterns 202 and 204 may be disposed adjacent to each other. A body region of the second conductivity type, that is, a P-type body region 106 may be disposed in an upper portion of the semiconductor region 104. A source region of the first conductivity type, that is, an N-type source region 108 may be disposed in an upper portion of the P-type body region 106. The N-type source region 108 may be separated from the semiconductor region 104 by the P-type body region 106. The N-type source region 108 may be electrically coupled to a source terminal S. An upper portion of the P-type body region 106 located between the N-type source region 108 and an upper portion of the semiconductor region 104 may be defined as a channel region 112. A drain region of the first conductivity type, that is, an N-type drain region 110 may be disposed in an upper portion of the semiconductor region 104. The N-type drain region 110 may be separated from the P-type body region 106 by the semiconductor region 104. The N-type drain region 110 may be electrically coupled to a drain terminal D.

The first insulation pattern 202 having a first thickness may be disposed on the first region 206A of the semiconductor region 104. The first insulation pattern 202 may act as a gate insulation pattern. In an embodiment, the first insulation pattern 202 may include an oxide layer. The second insulation pattern 204 having a second thickness may be disposed on the second region 206B of the semiconductor region 104. The second insulation pattern 204 may act as a field plate insulation pattern. In an embodiment, the second insulation pattern 204 may include an oxide layer. The first and second insulation patterns 202 and 204 may be of the same material layer. Alternatively, the first insulation pattern 202 may include a different material layer from the second insulation pattern 204. The second insulation pattern 204 may be disposed on the second region 206B of the semiconductor region 104 and may extend onto the N-type drain region 110. Thus, a portion of the second insulation pattern 204 may vertically overlap with a portion of the N-type drain region 110. A side surface of the first insulation pattern 202 may be in direct contact with a side surface of the second insulation pattern 204 on a boundary region between the first and second regions 206A and 206B. The second thickness corresponding to a substantial thickness of the second insulation pattern 204 may be greater than the first thickness corresponding to a substantial thickness of the first insulation pattern 202. A bottom surface of the first insulation pattern 202 may be located at substantially the same level as a bottom surface of the second insulation pattern 204. Accordingly, a top surface of the second insulation pattern 204 may be located at a level which is higher than a level of a top surface of the first insulation pattern 202. Thus, the first and second insulation patterns 202 and 204 may provide a step structure on a boundary region between the first and second regions 206A and 206B.

The gate electrode 206 may be disposed on the first insulation pattern 202 and may extend onto the second insulation pattern 204 located on the second region 206B of the semiconductor region 104. The gate electrode 206 may be electrically coupled to a gate terminal G. One side surface of the gate electrode 206 adjacent to the N-type source region 108 may be aligned with a side surface of the first insulation pattern 202. Another side surface of the gate electrode 206 adjacent to the N-type drain region 110 may be located on the second insulation pattern 204. The gate electrode 206 disposed on the first insulation pattern 202 on the first region 206A may have substantially the same thickness as the gate electrode 206 disposed on the second insulation pattern 204 on the second region 206B. Thus, the gate electrode 206 may have a stepped surface profile due to a level difference on a boundary region between the first and second regions 206A and 206B. A level difference between a top surface of the gate electrode 206 on the first region 206A and a top surface of the gate electrode 206 on the second region 206B may be the same as a level difference between a top surface of the first insulation pattern 202 and a top surface of the second insulation pattern 204. In an embodiment, the gate electrode 206 may be formed or comprised of a doped polysilicon layer. A gate spacer 208 may be disposed on each of the side surfaces of the gate electrode 206. The gate spacer 208 may be formed or comprised of an insulation layer.

The gate electrode 206 may have a doping profile that a position of a maximum projection range Rp of impurity ions distributed in the gate electrode 206 over the first region 206A is located at substantially the same level as a position of a maximum projection range Rp of impurity ions distributed in the gate electrode 206 over the second region 206B, as indicated by a dotted line 300. The maximum projection range Rp of impurity ions is defined as a maximum projection depth in the distribution of the implanted ions along to the implanted direction. In general, if a certain gate electrode is provided to have the same shape as the gate electrode 206, a position of a maximum projection range Rp of impurity ions distributed in the certain gate electrode over the first region 206A may be located at a relatively lower level than a position of a maximum projection range Rp of impurity ions distributed in the certain gate electrode over the second region 206B. That is, positions of the maximum projection range Rp of the impurity ions distributed in the certain gate electrode may be located at the same distance from a top surface of the certain gate electrode throughout the certain gate electrode. This may be due to a fact that an ion implantation buffer layer having a uniform thickness is formed on the certain gate electrode having a stepped surface profile and impurity ions are then implanted into the certain gate electrode using the ion implantation buffer layer as a screen layer. In such a case, if a gate voltage is applied to the certain gate electrode, a vertical electric field generated across the second insulation pattern 204 on the second region 206B may be remarkably lower than a vertical electric field generated across the first insulation pattern 202 on the first region 206A. As a result, a current drivability (e.g., a drain current drivability) in the second region 206B of the semiconductor region 104 may become significantly lower than a current drivability (e.g., a drain current drivability) in the first region 206A of the semiconductor region 104.

In contrast, in accordance with the present embodiment, a position of the maximum projection range Rp of the impurity ions distributed in the gate electrode 206 on the first region 206A may be located at substantially the same level as a position of the maximum projection range Rp of the impurity ions distributed in the gate electrode 206 on the second region 206B. This means that a lower portion of the gate electrode 206 adjacent to the second insulation pattern 204 is sufficiently doped with the impurity ions. Thus, even though a vertical electric field on the second region 206B and a current drivability in the second region 206B are still lower than a vertical electric field on the first region 206A and a current drivability in the first region 206A, a difference between a vertical electric field on the second region 206B and a vertical electric field on the first region 206A as well as a difference between a current drivability in the second region 206B and a current drivability in the first region 206A may be reduced as compared with the general case. That is, in accordance with the embodiment, a vertical electric field on the second region 206B may increase to improve a current drivability in the second region 206B due to the doping profile of the gate electrode 206. In addition, since a lower portion of the gate electrode 206 adjacent to the second insulation pattern 204 is heavily doped with the impurity ions, it may prevent an impurity depletion phenomenon (also, referred to as a poly depletion phenomenon) from occurring in the lower portion of the gate electrode 206. The poly depletion phenomenon may occur due to lack of a dose and an energy of an ion implantation process for doping a gate electrode (e.g., a polysilicon gate electrode) or lack of activation of impurity ions in the polysilicon gate electrode during a thermal diffusion process. If the poly depletion phenomenon occurs in a lower portion of the polysilicon gate electrode adjacent to a gate insulation layer, impurity ions may be depleted in the lower portion of the polysilicon gate electrode and a portion of a gate voltage applied to the polysilicon gate electrode may be applied to the impurity depletion region of the polysilicon gate electrode. Thus, a threshold voltage of a MOS device including the polysilicon gate electrode may increase. However, in accordance with the present embodiment, occurrence of the poly depletion phenomenon may be suppressed because the lower portion of the gate electrode 206 adjacent to the second insulation pattern 204 is heavily doped with the impurity ions.

Figure 2:
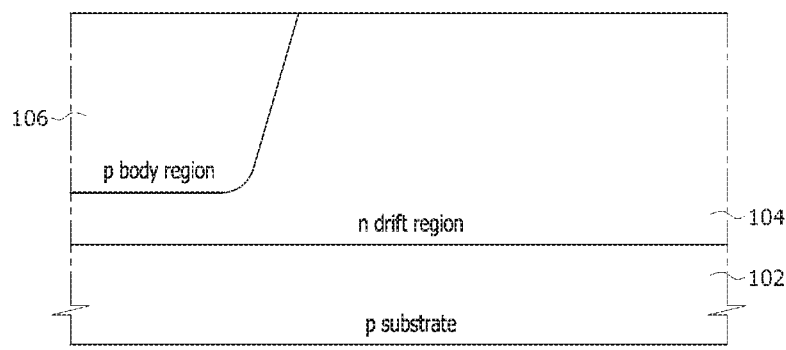
FIGS. 2 to 5 are cross-sectional views illustrating a method of fabricating a high voltage semiconductor device in accordance with an embodiment of the present disclosure.

FIGS. 2 to 5 are cross-sectional views illustrating a method of fabricating a high voltage semiconductor device in accordance with an embodiment of the present disclosure. Referring to FIG. 2, a semiconductor substrate 102 may be provided. The semiconductor substrate 102 may be a silicon substrate, a silicon-on-insulator (SOI) substrate, or a silicon germanium-on-insulator (SiGeOI) substrate. If the high voltage semiconductor device is an N-channel LDMOS transistor, the semiconductor substrate 102 may be P-type. An N-type semiconductor region 104, that is, an N-type drift region may be formed on the semiconductor substrate 102. In an embodiment, the semiconductor region 104 may be formed by doping an upper portion of the semiconductor substrate 102 with N-type impurities such as phosphorus ions. Next, P-type impurities such as boron ions may be implanted into a portion of the semiconductor region 104 using a predetermined mask pattern to form a P-type body region 106 in an upper portion of the semiconductor region 104.

Figure 3:
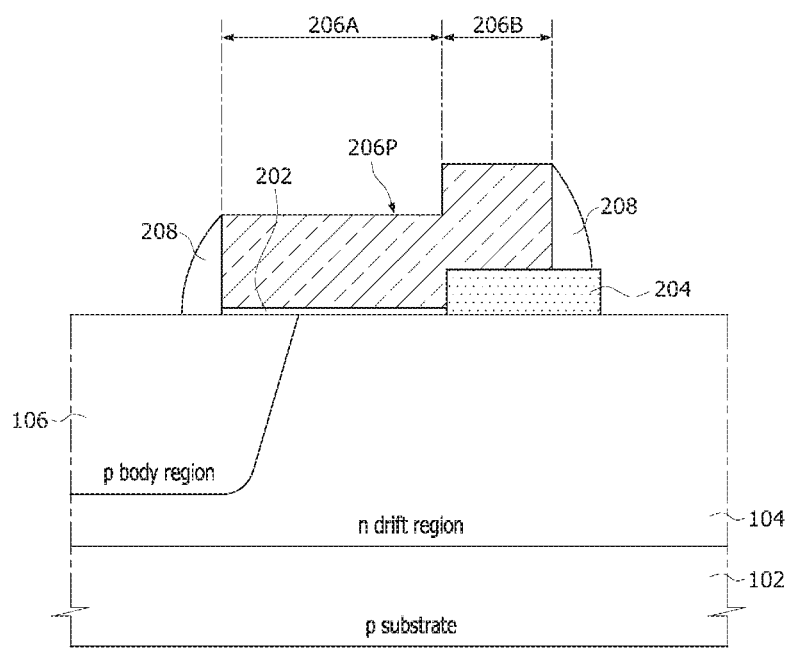

Referring to FIG. 3, a first insulation pattern 202 and a second insulation pattern 204 may be formed on the semiconductor region 104. The first insulation pattern 202 may be formed to extend onto a portion of the P-type body region 106 by a predetermined length. One side surface of the first insulation pattern 202 may be in direct contact with one side surface of the second insulation pattern 204. The first insulation pattern 202 may have a first thickness, and the second insulation pattern 204 may have a second thickness which is greater than the first thickness. In an embodiment, the first and second insulation patterns 202 and 204 may be formed of the same material layer, for example, an oxide layer. The first insulation pattern 202 may be formed on a first region 206A of the semiconductor region 104. The second insulation pattern 204 may be formed on a second region 206B of the semiconductor region 104 and may extend onto a portion of the semiconductor region 104 adjacent to the second region 206B. The first region 206A of the semiconductor region 104 may be defined as a region that vertically overlaps with the first insulation pattern 202 and a portion of a gate electrode which is formed in a subsequent process. The second region 206B of the semiconductor region 104 may be defined as a region that vertically overlaps with the second insulation pattern 204 and another portion of the gate electrode which is formed in a subsequent process. A bottom surface of the first insulation pattern 202 and a bottom surface of the second insulation pattern 204 may be located at substantially the same level as a top surface of the semiconductor region 104. Since the second insulation pattern 204 is thicker than the first insulation pattern 202, a top surface of the second insulation pattern 204 may be located at a level which is higher than a level of a top surface of the first insulation pattern 202.

A gate pattern 206P may be formed on the first and second insulation patterns 202 and 204. On the first region 206A of the semiconductor region 104, a bottom surface of the gate pattern 206P may be in direct contact with a top surface of the first insulation pattern 202. On the second region 206B of the semiconductor region 104, a bottom surface of the gate pattern 206P may be in direct contact with a top surface of the second insulation pattern 204. The gate pattern 206P may be formed to have a stepped surface profile on a boundary region between the first and second regions 206A and 206B. In an embodiment, the gate pattern 206P may have a uniform thickness. That is, a thickness of the gate pattern 206P on the first region 206A of the semiconductor region 104 may be substantially equal to a thickness of the gate pattern 206P on the second region 206B of the semiconductor region 104. Thus, a top surface of the gate pattern 206P on the second region 206B of the semiconductor region 104 may be located at a level which is higher than a level of a top surface of the gate pattern 206P on the first region 206A of the semiconductor region 104. In an embodiment, the gate pattern 206P may be formed of a polysilicon layer. For example, the gate pattern 206P may be formed of an undoped polysilicon layer or a lightly doped polysilicon layer. A gate spacer 208 may be formed on each of the side surfaces of the gate pattern 206P. In an embodiment, the gate spacer 208 may be formed of an insulation layer, for example, a nitride layer.

Figure 4:
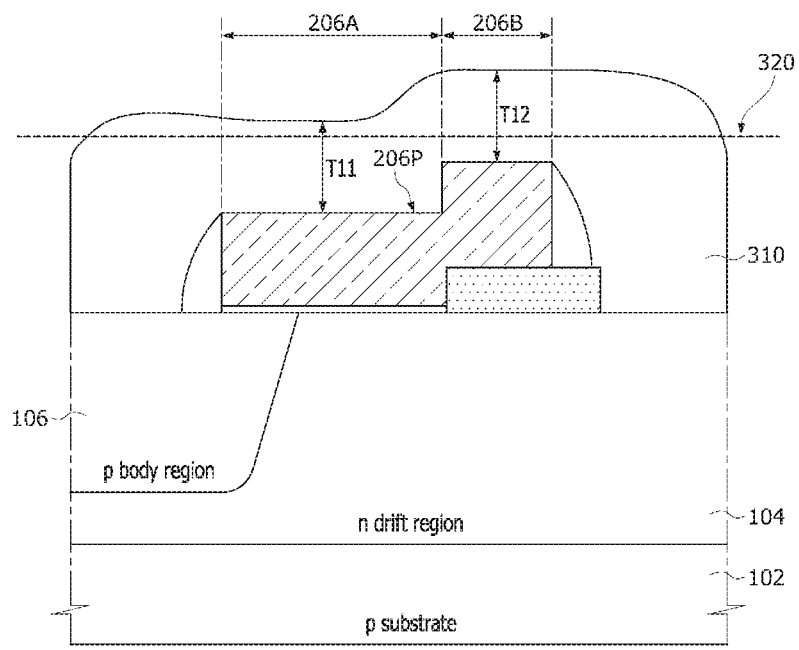

Referring to FIG. 4, an ion implantation buffer layer 310 may be formed on the semiconductor region 104 and the P-type body region 106 to cover the gate pattern 206P and the gate spacer 208. In an embodiment, the ion implantation buffer layer 310 may be formed on an oxide layer. Since the gate pattern 206P is formed to have a stepped surface profile on a boundary region between the first and second regions 206A and 206B, the ion implantation buffer layer 310 may also be formed to have a stepped surface profile on a boundary region between the first and second regions 206A and 206B. A thickness T11 of the ion implantation buffer layer 310 on the first region 206A may be substantially equal to a thickness T12 of the ion implantation buffer layer 310 on the second region 206B. The ion implantation buffer layer 310 may be formed such that a top surface of the ion implantation buffer layer 310 on the first region 206A is located at a level which is higher than a level of a top surface of the gate pattern 206P on the second region 206B. Thus, the thickness T11 of the ion implantation buffer layer 310 on the first region 206A may be greater than a level difference between a top surface of the gate pattern 206P on the first region 206A and a top surface of the gate pattern 206P on the second region 206B. After the ion implantation buffer layer 310 having a stepped surface profile is formed, a planarization process may be applied to the ion implantation buffer layer 310 to provide a planarized surface located at a level indicated by a dotted line 320 of FIG. 4. In an embodiment, the planarization process applied to the ion implantation buffer layer 310 may be performed using a chemical mechanical polishing (CMP) technique.

Figure 5:
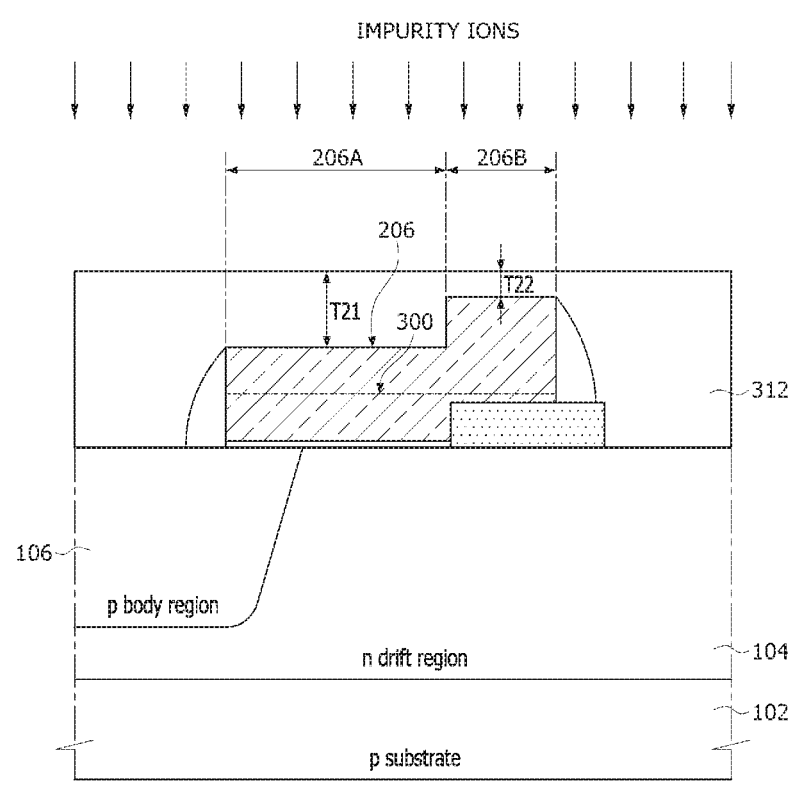

Referring to FIG. 5, a planarized ion implantation buffer layer 312 may be formed by applying the planarization process to the ion implantation buffer layer 310, A top surface of the planarized ion implantation buffer layer 312 may be substantially flat to correspond to a horizontal level. Accordingly, a thickness T21 of the planarized ion implantation buffer layer 312 on the first region 206A may be greater than a thickness T22 of the planarized ion implantation buffer layer 312 on the second region 206B. After the planarized ion implantation buffer layer 312 is formed, impurity ions may be implanted into the gate pattern 206P using the planarized ion implantation buffer layer 312 as a screen layer to form a gate electrode 206. The doping process (e.g., an ion implantation process) for forming the gate electrode 206 may be performed such that a position of a maximum projection range Rp of the impurity ions is located in a lower portion of the gate pattern 206P on the second region 206B as indicated by a dotted line 300. In such a case, the position of the maximum projection range Rp of the impurity ions may be located in a middle portion of the gate pattern 206P on the first region 206A due to a difference between the thickness T21 and the thickness T22. That is, the position of the maximum projection range Rp of the impurity ions may be located in a middle portion of the gate pattern 206P on the first region 206A and may be located in a lower portion of the gate pattern 206P on the second region 206B. If the thickness T21 of the planarized ion implantation buffer layer 312 on the first region 206A and the thickness T22 of the planarized ion implantation buffer layer 312 on the second region 206B are appropriately adjusted, the maximum projection range Rp of the impurity ions distributed in the gate electrode 206 may be located at a horizontal level corresponding to the dotted line 300. After the doping process for forming the gate electrode 206 is performed, the planarized ion implantation buffer layer 312 may be removed. Subsequently, N-type impurity ions may be implanted into the semiconductor region 104 and the P-type body region 106 using an appropriate mask pattern, thereby forming an N-type source region in the P-type body region 106 and an N-type drain region in the semiconductor region 104.

In accordance with the embodiments described above, impurity ions may be implanted into a gate pattern having a step structure due to a field plate insulation pattern thicker than a gate insulation pattern such that a position of a maximum projection range of the impurity ions is located at a horizontal level in the gate pattern. As a result, a lower portion of the gate pattern adjacent to the field plate insulation pattern may be heavily doped with the impurity ions to prevent a poly depletion phenomenon from occurring in the lower portion of the gate pattern and to improve a current drivability in a semiconductor region below the field plate insulation pattern.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A high voltage semiconductor device comprising:
 a semiconductor region of a first conductivity type having a first region and a second region;
 a first insulation pattern disposed over the first region of the semiconductor region to have a first thickness;
 a second insulation pattern disposed over the second region of the semiconductor region to have a second thickness greater than the first thickness; and
 a gate electrode disposed over the first and second insulation patterns to have a step structure over a boundary region between the first and second regions,
 wherein the gate electrode has a doping profile such that a position of a maximum projection range of impurity ions distributed in the gate electrode over the first region is located at substantially the same level as a position of a maximum projection range of impurity ions distributed in the gate electrode over the second region, and
 wherein a top surface of the gate electrode over the second region is located at a level higher than a level of a top surface of the gate electrode over the first region.

2. The high voltage semiconductor device of claim 1,
 wherein the first region vertically overlaps with the first insulation pattern and a portion of the gate electrode; and
 wherein the second region vertically overlaps with the second insulation pattern and another portion of the gate electrode.

3. The high voltage semiconductor device of claim 1,
 wherein the first insulation pattern is a gate insulation pattern; and
 wherein the second insulation pattern is a field plate insulation pattern.

4. The high voltage semiconductor device of claim 1,
 wherein a bottom surface of the first insulation pattern is located at substantially the same level as a bottom surface of the second insulation pattern; and
 wherein a top surface of the second insulation pattern is located at a level higher than a level of a top surface of the first insulation pattern.

5. The high voltage semiconductor device of claim 1, wherein each of the first and second insulation patterns includes an oxide layer.

6. The high voltage semiconductor device of claim 1, wherein a thickness of the gate electrode over the first region is substantially equal to a thickness of the gate electrode over the second region.

7. The high voltage semiconductor device of claim 1, wherein a level difference between a top surface of the gate electrode over the first region and a top surface of the gate electrode over the second region is substantially equal to a level difference between a top surface of the first insulation pattern over the first region and a top surface of the second insulation pattern over the second region.

8. The high voltage semiconductor device of claim 1, further comprising:
 a body region of the first conductivity type disposed in an upper portion of the semiconductor region;
 a source region of a second conductivity type disposed in an upper portion of the body region of the first conductivity type; and
 a drain region of the second conductivity type disposed in an upper portion of the semiconductor region.

9. The high voltage semiconductor device of claim 8, wherein the second insulation pattern over the second region extends onto a portion of the drain region.

10. A semiconductor device comprising:
 a gate electrode disposed over first and second insulation patterns to have a step structure on a boundary region between the first and second insulation patterns, wherein the gate electrode has a doping profile such that a position of a maximum projection range of impurity ions distributed in the gate electrode over the first insulation pattern is located at substantially the same level as a position of a maximum projection range of impurity ions distributed in the gate electrode over the second insulation pattern, and wherein a top surface of the gate electrode over the second insulation pattern is located at a level higher than a level of a top surface of the gate electrode over the first insulation pattern.

\* \* \* \* \*